United States Patent
Schiller et al.

(10) Patent No.: US 10,680,591 B2
(45) Date of Patent: Jun. 9, 2020

(54) PROGRAMMABLE RESISTIVE DELAY

(71) Applicant: Hewlett Packard Enterprise Development LP, Houston, TX (US)

(72) Inventors: Chris Schiller, Ft. Collins, CO (US); Adam Johnson, Ft. Collins, CO (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/942,797

(22) Filed: Apr. 2, 2018

(65) Prior Publication Data

US 2019/0305764 A1    Oct. 3, 2019

(51) Int. Cl.
  *H03K 5/134*    (2014.01)
  *H03K 5/00*    (2006.01)

(52) U.S. Cl.
  CPC ... *H03K 5/134* (2014.07); *H03K 2005/00019* (2013.01); *H03K 2005/00195* (2013.01)

(58) Field of Classification Search
  CPC ...................................... H03K 5/134
  See application file for complete search history.

(56) References Cited

U.S. PATENT DOCUMENTS

| | | |
|---|---|---|
| 5,920,210 A | 7/1999 | Kaplinsky |
| 6,028,903 A | 2/2000 | Drost et al. |
| 6,144,786 A | 11/2000 | Chethik |
| 7,598,788 B2 | 10/2009 | Cao |
| 8,593,208 B2 * | 11/2013 | Kim ........... H03K 5/131 327/149 |
| 9,584,107 B2 * | 2/2017 | Huang ........... H03K 5/14 |
| 2007/0146024 A1 | 6/2007 | Allan |
| 2014/0361821 A1 | 12/2014 | Connell et al. |
| 2018/0054118 A1 | 2/2018 | Lee et al. |

FOREIGN PATENT DOCUMENTS

| | | |
|---|---|---|
| JP | 2003-152528 A | 5/2003 |
| JP | 2005-136664 A | 5/2005 |

OTHER PUBLICATIONS

Abdulrazzaq, B. I. et al., "A Review on High-Resolution CMOS Delay Lines: Towards Sub-Picosecond Jitter Performance," (Research Paper), Springerplus, Apr. 12, 2016, vol. 5, No. 434, https://www.ncbi.nlm.nih.gov/pmc/articles/PMC4828372/.

International Search Report and Written Opinion received for PCT Application No. PCT/US2019/25339, dated Jul. 23, 2019, 10 pages.

* cited by examiner

*Primary Examiner* — Hai L Nguyen
(74) *Attorney, Agent, or Firm* — Hewlett Packard Enterprise Patent Department

(57) ABSTRACT

An example delay circuit is described that includes an input node to receive a first signal, a first circuit path, a second circuit path, an output buffer, and an output node. The first circuit path includes at least one first buffer and a first array of switches. The second circuit path includes at least one second buffer and a second array of switches. The output buffer receives a mixed output of the first circuit path and the second circuit path. The output node transmits a second signal equivalent to the first signal with a programmed delay.

20 Claims, 7 Drawing Sheets

PROGRAMMABLE RESISTIVE DELAY

GOVERNMENT RIGHTS

This invention was made with Government support under Agreement Number H98230-14-3-0011. The Government has certain rights in the invention.

BACKGROUND

Variable delay circuits are used in many applications, often to adjust the phase of an input signal. In some applications, variable delay circuits align clock edges between multiple systems. Variable delay circuits have certain parameters that are characteristic of the specific circuit design that effect the applicability of the circuit to a certain application. Three examples of these certain parameters are resolution (e.g. the number of selectable delays between the minimum delay and the maximum delay), noise susceptibility (e.g. distortions to the output signal caused by noise introduced to the input signal), maximum operable frequency (e.g. the maximum frequency at which a clocked signal can be input into the variable delay circuit without unacceptable levels of signal degradation), and maximum data rate (e.g. the highest amount of bandwidth that can pass through the variable delay circuit without unacceptable levels of signal degradation, such as inter-symbol interference). In some variable delay circuits, the certain parameters change depending on the selected delay. For example, in variable delay circuits that rely on the R-C (resistive-capacitive) response of the circuit, noise susceptibility may become more prominent as the selected delay increases.

BRIEF DESCRIPTION OF THE DRAWINGS

For a more complete understanding of the present disclosure, examples in accordance with the various features described herein may be more readily understood with reference to the following detailed description taken in conjunction with the accompanying drawings, where like reference numerals designate like structural elements, and in which.

Figure 1:
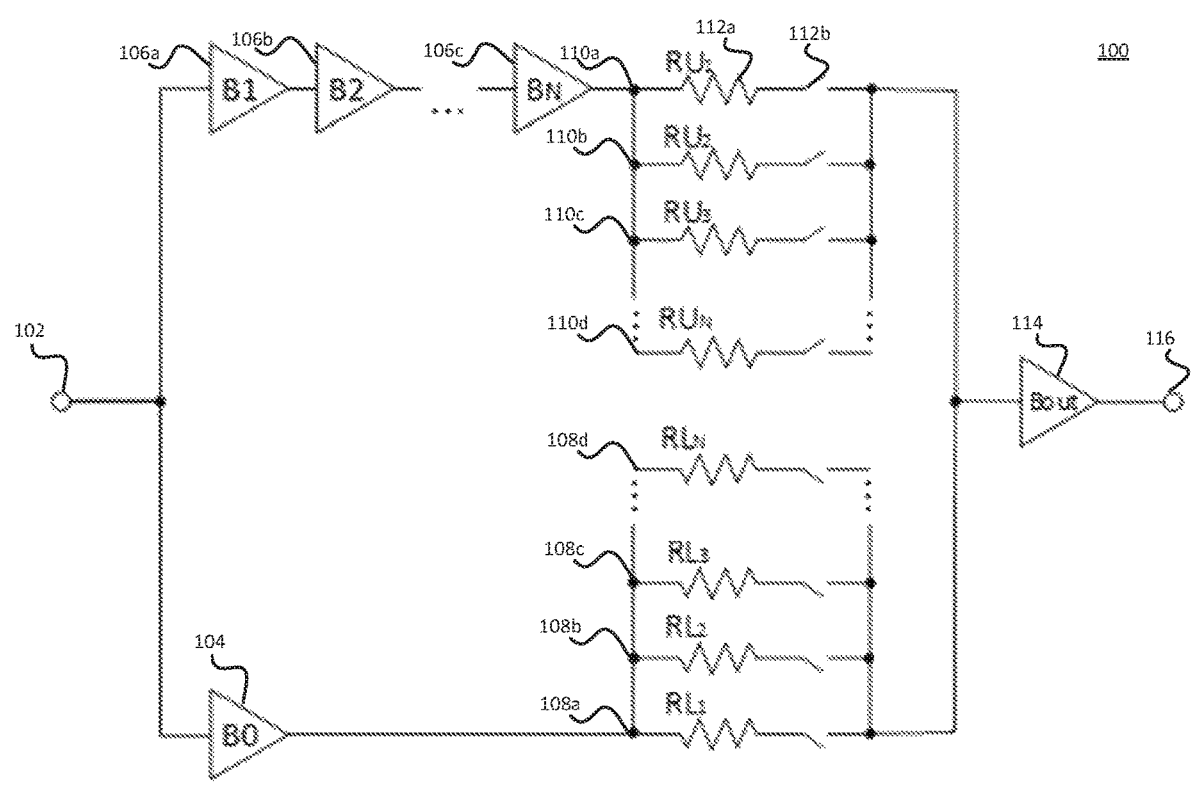
FIG. 1 illustrates an example delay circuit.

Certain examples have features that are in addition to or in lieu of the features illustrated in the above-referenced figures. Certain labels may be omitted from certain figures for the sake of clarity.

DETAILED DESCRIPTION

Programmable delay circuits have certain performance characteristics dependent on the hardware design of the specific programmable delay circuit. Some performance characteristics affect the suitability of the programmable delay circuit for use in a specific application. For example, an application that requires a large delay of a high-bandwidth signal would not be able to use a programmable delay circuit that has a relatively poor maximum data rate at large delays, Four example performance characteristics include maximum data rate, noise susceptibility, resolution, maximum operable frequency, and delay range (i.e. the range between minimum delay and maximum delay).

Performance characteristics may differ for a particular programmable delay circuit depending on the programmable delay circuit's configuration. For example, a certain programmable delay circuit's maximum data rate when configured for a minimum delay may be more than the programmable delay circuit's maximum data rate when configured for a maximum delay. Performance characteristics may also differ based on a programmable delay circuit's design. For example, a programmable delay circuit designed with a delay range of X may have more desirable performance characteristics that a programmable delay circuit using similar technology that is designed with a delay range of X+10.

An example programmable delay circuit includes two circuit paths, a low-delay path and a high-delay path. An input signal received at an input of the example programmable delay circuit is split and transmitted to both the low-delay path and the high-delay path. The low-delay path includes a certain number of buffers (for example, one buffer) and a first parallel array of resistive switches. The high-delay path includes a different certain number of buffers (for example, four buffers) and a second parallel array of resistive switches. The low-delay path defines the minimum delay through the programmable delay circuit, and the high-delay path defines the maximum delay through the programmable delay circuit.

The resolution of the example programmable delay circuit is determined by the number of resistive switches in the first parallel array of resistive switches and the second parallel array of resistive switches. Depending on the ratio between effective resistance of the first parallel array and the effective resistance of the second parallel array, the input signal is delayed a certain amount. The more resistive switches in each of the first parallel array and the second parallel array, the more resolution the programmable delay circuit has.

An example operation of an example programmable delay circuit is described in the following. An input signal is received at the input of the programmable delay circuit. The example programmable delay circuit has a minimum delay of 1 us (microsecond) and 10 us (microseconds). Based on the settings of the resistive switches in the first parallel array and the second parallel array, a ratio of effective resistances between the first parallel array and the second parallel array determines the delay of the programmable delay circuit. For example, a ratio of 4:1 may result in a delay of 8 us, and a ratio of 1:3 may result in a delay of 2 us. The effective resistances on the low-delay path and the high-delay path determine the proportion of the output signal of each path mixed into the output of the programmable delay circuit. If the low-delay signal is a higher proportion of the output signal, the delay of the output signal is delayed less relative to when the high-delay signal is a higher proportion of the output signal.

Since the delay variation of the example programmable delay circuit is not achieved via bandwidth reduction, but rather through mixing of two full-bandwidth signals, the delay range of the example programmable delay circuit is not inversely related to the bandwidth of the programmable delay circuit.

FIG. 1 illustrates an example programmable delay circuit. Programmable delay circuit 100 includes an input node 102, a first circuit path including buffers 104 and an array of resistive switches 108, a second circuit path including buffers 106 and an array of resistive switches 110, an output buffer 114, and an output node 116. Each resistive switch 108 and 110 includes a resistive portion 112a and a switching portion 112b. In some examples, the resistive portion 112a is a separate component from the switching portion 112b (e.g. a resistor electrically coupled in series with a switch). In some other examples, the resistive portion 112a and the switching portion 112b are a single component or group of components (e.g. a complementary metal-oxide semiconductor (CMOS) switch).

The first circuit path is a low-delay path, and includes fewer buffers 104 than the second circuit path, which is a high-delay path has buffers 106. In some examples, the first circuit path includes zero buffers 104. In some other examples, the first circuit path includes one buffer 104. In yet other examples, the first circuit path includes multiple buffers 104. The example of FIG. 1 illustrates the first circuit path including one buffer 104, "B0".

The second circuit path is a high-delay path including buffers 106. Each buffer 104 and 106 induces a delay on the signal passing through the respective circuit. For example, a signal input in the high-delay path may pass through four (4) buffers 106, each delaying the signal by 1 us. The resultant output signal from the high-delay path would be delayed by 4 us. When the output signal from the high-delay path mixes with the output signal from the low-delay path, the resultant output signal of the programmable delay circuit is a delayed version of the input signal, with the delay corresponding to the effective resistances of the high-delay path and the low-delay path.

The array of resistive switches 108 of the first circuit path each include a resistive portion 112a and a switching portion 112b. However, the resistive portion 112a and the switching portion 112b are not necessarily discrete components. For example, each resistive switch 108 may be a CMOS switch with a certain resistance when the switch is closed (i.e. allows current to flow through). In some examples, each resistive switch 108a-d has a resistive portion 112a that is a different value from other resistive switches 108. In some other examples, each resistive switch 108 has a resistive portion 112a that is the same value as other resistive switches 108.

In an example of FIG. 1 wherein the only resistive switches 108 of the low-delay path are the ones shown (i.e. there are no resistive switches 108 between resistive switch 108c and resistive switch 108d), the four resistive switches 108 are electrically coupled in parallel and are combined into an effective resistance of the low-delay path. A few examples follow to illustrate the operation of the array of resistive switches 108

Example 1: $RL_1$ and $RL_2$

In a first example, resistive switches 108a and 108b are closed, while resistive switches 108c and 108d are left open. The equivalent (i.e. effective) resistance of the low-delay path, $R_{EQ}$, is thus the resistance of resistive switch 108a ($RL_1$) in parallel with the resistance of resistive switch 108b ($RL_2$), or $RL_1 \| RL_2$. By the equivalence equation $$\frac{1}{R_{EQ}} = \frac{1}{RL_1} + \frac{1}{RL_2},$$

the equivalent resistance of the low-delay path is $$\frac{RL_1 RL_2}{RL_1 + RL_2}.$$

For example, if $RL_1$ is 15Ω and $RL_2$ is 5Ω, $R_{EQ}$ is 3.75Ω.

Example 2: $RL_1$, $RL_2$, $RL_3$, and $RL_N$

In a second example, resistive switches 108a, 108b, 108c, and 108d are closed. The equivalent resistance of the low-delay path, $R_{EQ}$, is thus the resistance of resistive switch 108a ($RL_1$) in parallel with the resistance of resistive switch 108b ($RL_2$) in parallel with the resistance of resistive switch 108c ($RL_3$) in parallel with the resistance of resistive switch 108d ($RL_N$), or $RL_1 \| RL_2 \| RL_3 \| RL_N$. For example, if $RL_1$ is 15Ω, $RL_2$ is 5Ω, $RL_3$ is 15Ω, and $RL_N$ is 5Ω, $R_{EQ}$ is 1.875Ω. Of note, closing additional resistive switches 108 can reduce the effective resistance of the low-delay path.

Example 3: All Switches Open

In a third example, all resistive switches 108 are open. The equivalent resistance of the low-delay path is thus effectively infinite. In this configuration, all of the current passes through the high-delay path (assuming that at least one resistive switch 110 is closed), and the programmable delay circuit is in its maximum delay configuration.

Similarly as described in relation to the array of resistive switches 108 for the low-delay path, the array of resistive switches 110 for the high-delay path also have an effective resistance determined by the resistive portions 112a of the resistive switches 110 with closed switching portions 112.

Once an input signal has passed from input node 102 through the high-delay path and the low-delay path, the signal output from the high-delay path is delayed by the maximum delay amount of the programmable delay circuit and the signal output from the low-delay path is delayed by the minimum delay amount of the programmable delay circuit. The signals from the high- and low-delay paths are mixed at the input to output buffer 114, which buffers the mixed signal to output node 116.

In operation, an example programmable delay circuit is configured by opening and closing switching portions 112b of resistive switches 108 and 110. The array of resistive switches 108 of the low-delay path has a first effective resistance, and the array of resistive switches 110 of the high-delay path has a second effective resistance. The amount of delay imparted on the output signal at output node 116 in comparison to the input signal at input node 102 corresponds to the ratio of the first effective resistance to the second effective resistance. For example, a programmable delay circuit configured so that the ratio of first effective resistance to second effective resistance is 4:1 may impart a delay that is near the minimum amount of delay the programmable delay circuit is capable of imparting. If the same example programmable delay circuit is configured so that the ratio of first effective resistance to second effective resistance is 1:4, it may impart a delay that is near the maximum amount of delay the programmable delay circuit is capable of imparting.

Figure 2:
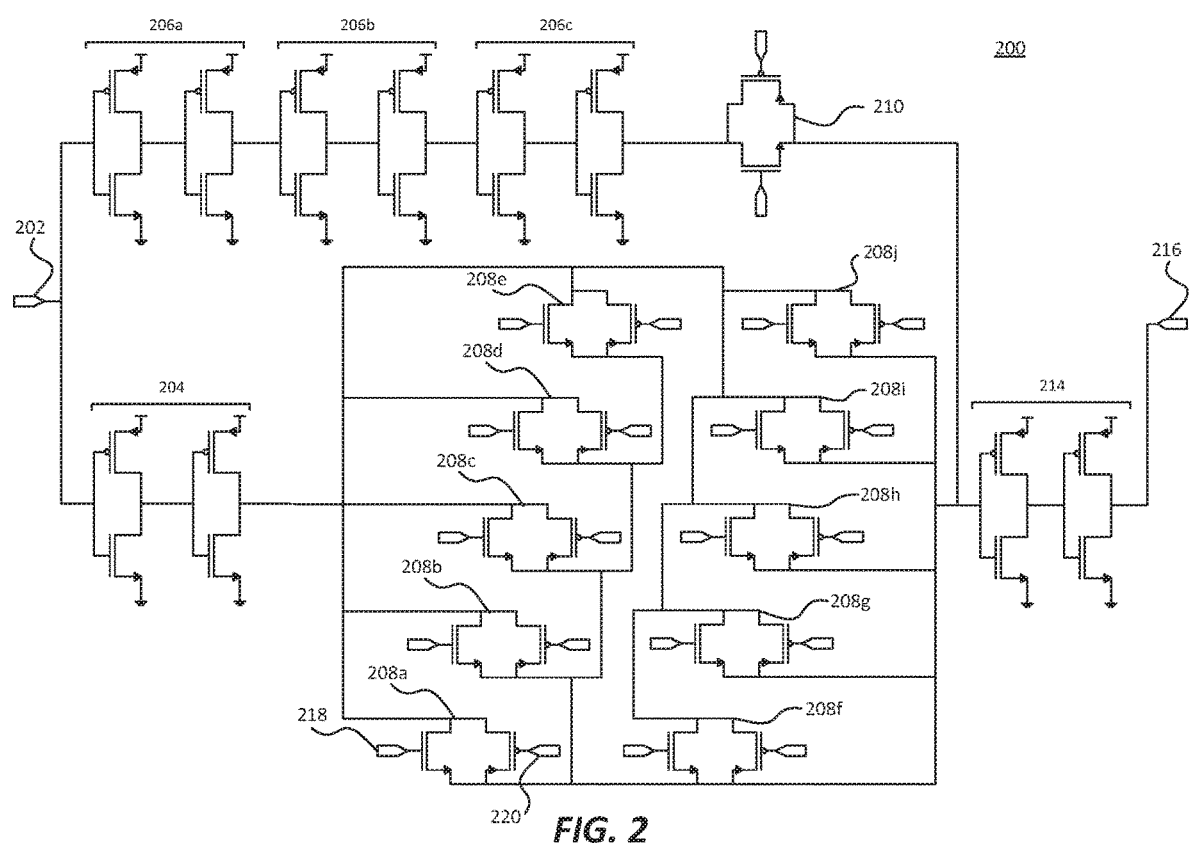
FIG. 2 illustrates an example delay circuit schematic.

FIG. 2 illustrates an example delay circuit schematic. Programmable CMOS delay circuit ("delay circuit") 200 includes an input node 202, a low-delay path including buffer 204 and resistive switches 208, a high delay path including buffers 206 and resistive switch 210, an output buffer 214, and an output node 216. Each resistive switch 208 and 210 includes control lines 218 and 220, When control line 218 is a high signal and control line 220 is a low signal, the switch closes (i.e. current passes through the switch). In some examples, the signal on control line 220 is an inverted signal from control line 218.

In the example of FIG. 2, buffers 204, 206, and 214 each include a pair of inverters. When a signal is received as the input of a buffer 204, 206, or 214, the signal is inverted by the first inverter and then reinverted to the original signal by the second inverter. Each buffer 204, 206, or 214 induces a propagation delay on the received signal, a time that it takes to invert the signal and reinvert it. In the low-delay path, buffer 204 receives the input signal from input node 202. The input signal received at input node 202 may have deteriorated when input to buffer 204. Buffer 204 may reduce the susceptibility to certain deterioration of the signal, such as noise added to the signal by components of delay circuit 200. In some examples, deterioration of the signal occurs between the signal source and input node 202. Buffer 204 may also amplify the signal or increase the current of the signal as it flows through the low-delay path. Buffer 204 also induces a propagation delay on the signal. There is a small period of time when the signal has arrived at the input of buffer 204 and has not yet been inverted and reinverted and transmitted on the output of buffer 204. This propagation delay, along with propagation delays of the rest of the low-delay path and buffer 214 are the minimum configurable delay of delay circuit 200.

In the high-delay path, buffers 206a-c are electrically coupled in series with one another. Due to buffers 206a-c being coupled in series, their propagation delays sum together. For example, if each buffer 206 has a propagation delay of 1 us, the total propagation delay across buffers 206a-c (i.e. the time from when the signal is received at the input of buffer 206a to the time when the signal is transmitted from the output of buffer 206c) is 3 us. This propagation delay, along with propagation delays of the rest of the high-delay path and buffer 214 are the maximum configurable delay of delay circuit 200.

In the example of FIG. 2, resistive switches 208 and 210 are CMOS switches. Resistive switches 208a-j can be configured to adjust the effective resistance of the low-delay path. Resistive switch 210 is configured either to allow current to pass through the high-delay path while providing a fixed effective resistance or to prevent current from passing through the high-delay path when delay circuit 200 is configured for minimum delay. The ratio of effective resistances between the high-delay path and the low-delay path is determined based on the pattern of resistive switches 208a-j that are closed. For example, if resistive switches 208a, 208c, 208f, and 208i are closed to provide an effective resistance of 4Ω, and resistive switch 210 provides an effective resistance of 1Ω, the ratio of low-delay path effective resistance to high-delay path effective resistance is 4:1. In some examples, the larger the ratio of low-delay path effective resistance to high-delay path effective resistance, the more delay is imparted on the signal received at input node 202.

The example of FIG. 2 illustrates a delay circuit 200 comprising CMOS circuitry, which can be incorporated into an integrated circuit (IC) as a portion of the IC logic. In some examples, a controller (which may be located on the same IC as delay circuit 200) provides control signals to resistive switches 208 and 210 through control lines 218 and 220.

The following is an example operation of delay circuit 200. A controller configures resistive switches 208 and 210 to induce a delay of 5 us on a signal received at input node 202. Buffers 204, 206, and 214 each induce a delay of 2 us (NOTE: actual delay through a CMOS buffer may be substantially less than 2 us, all example delays used in this disclosure are chosen for mathematical clarity, not for technical accuracy based on a specific transistor technology), and any other propagation delays throughout delay circuit 200 are negligible. The delay through the high-delay path due to buffers 206a-c is 6 us. The delay through the low-delay path due to buffer 204 is 2 us. The delay through output buffer 214 is 2 us. Resultantly, the minimum configurable delay of delay circuit 200 is 4 us and the maximum configurable delay of delay circuit 200 is Bus. Since the desired 5 us delay is nearer to the minimum configurable delay than the maximum configurable delay, delay circuit 200 is configured to have a relatively low effective resistance on the low-delay path and a relatively high effective resistance on the high-delay path. For example, if resistive switch 210 has an effective resistance of 10Ω, resistive switches 208 may have an effective resistance of 20 to achieve a 1:5 ratio of low-delay effective resistance to high-delay effective resistance. In certain example delay circuits 200, a 1:5 ratio of low-delay effective resistance to high-delay effective resistance results in a 5 us delayed signal transmitted from output node 216.

Figure 3:
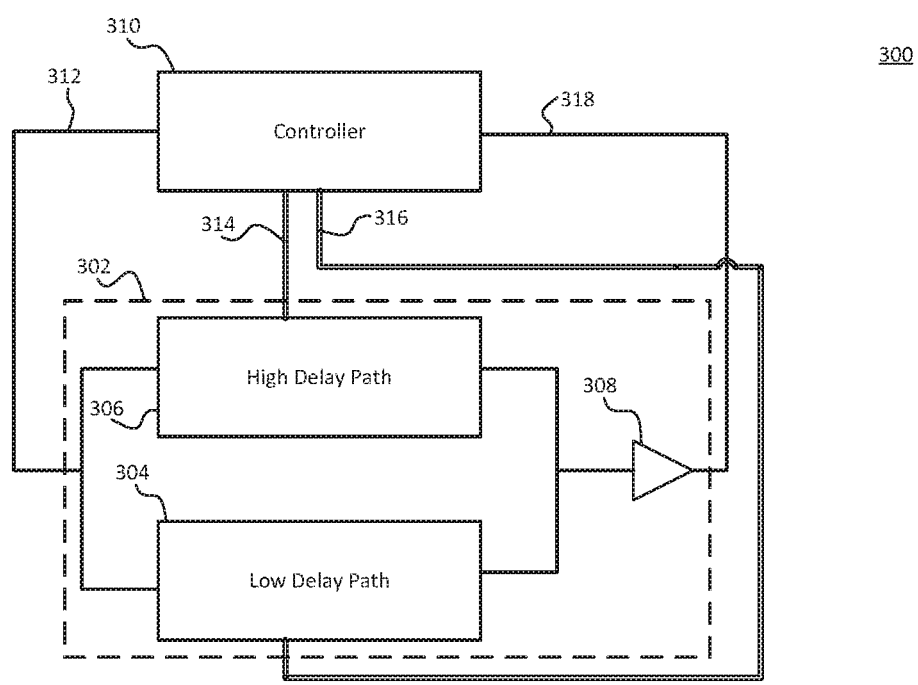
FIG. 3 illustrates an example signal delay system.

FIG. 3 illustrates an example signal delay system. Delay system 300 includes delay circuit 302 and controller 310. Delay circuit 302 includes a low-delay path 304, a high-delay path 306, and an output buffer 308. Controller 310 couples to delay circuit 302 via input signal line 312, high-delay path control lines 314, low-delay path control line 316, and output signal line 318.

Although the example system of FIG. 3 illustrate controller 310 providing the input signal to delay circuit 302 on input signal line 312 and receiving the output signal from delay circuit 302 on output signal line 318, the input signal may originate from a different source, and the output signal may be transmitted to a different source.

Based on the specific application of delay system 300, controller 310 uses stored information about arrays of resistive switches included in low-delay path 304 and high-delay path 306, respectively. In some examples, controller 310 stores information about the resistive switches, including each resistive switch's resistance. In such examples, controller 310 determines what ratio of effective resistance of low-delay path 304 to high-delay path 306 is required for a given delay. In such examples, controller 310 calculates, based on the resistance of each resistive switch, which switches should be closed to achieve the proper ratio of effective resistances for the desired delay.

In some other examples, controller 310 stores information about configurations of resistive switches, including which switches to close to achieve a certain delay. Controller 310 then closes the appropriate resistive switches of high-delay path 306 and low-delay path 304 to achieve the certain delay.

Controller 310 transmits control signals to resistive switches in high-delay path 306 through high-delay path control lines 314 and to resistive switches in low-delay path 304 through low-delay path control lines 316. In some examples, control signals for certain resistive switches include a primary control signal (i.e. "high" means closed, "low" means open) and an inverted control signal (i.e. "low" means closed, "high" means open). In some other examples, control signals for certain resistive switches include a primary control signal.

Figure 4:
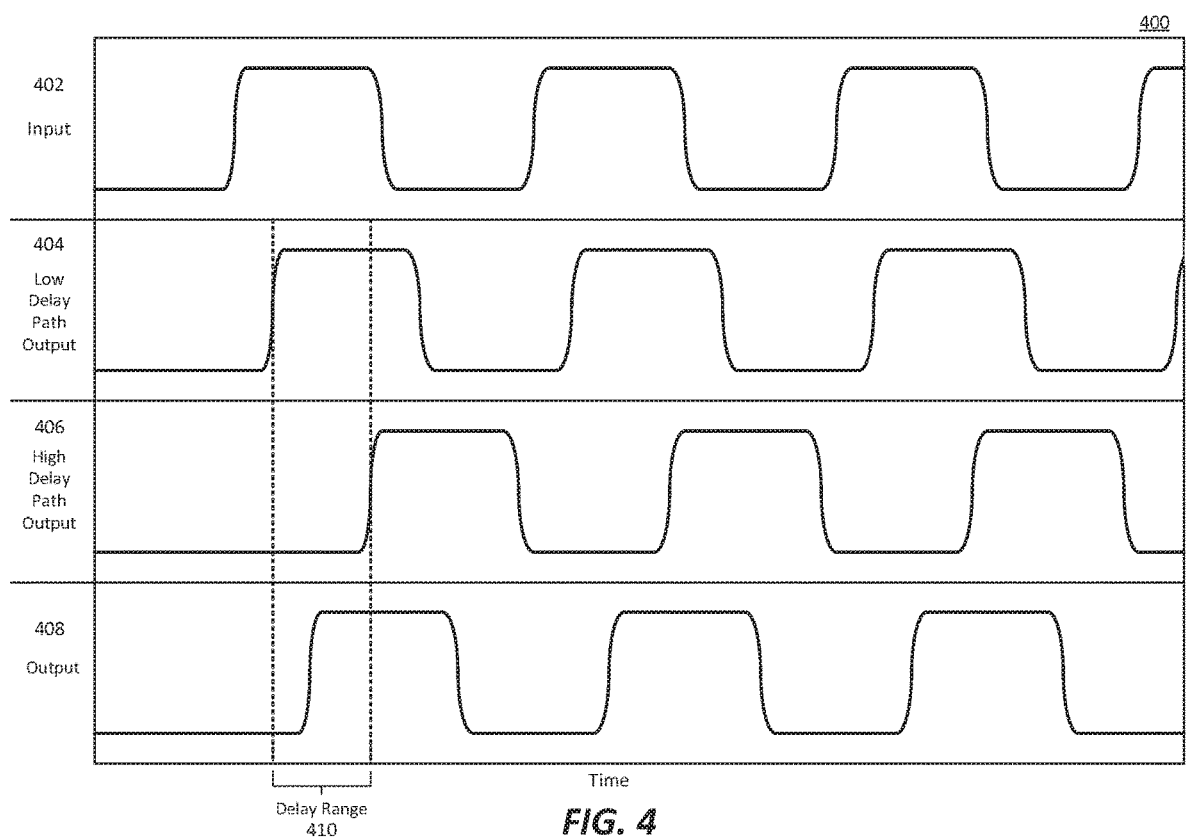
FIG. 4 is a waveform chart including example signals from an example delay circuit.

FIG. 4 is a waveform chart including example signals from an example delay circuit. Waveform chart 400 includes input signal 402, low-delay path output signal 404, high-delay path output signal 406, and delay circuit output signal 408. Delay range 410 shows the range of delays the example delay circuit can impart on the input signal, shown in relation to the initial edge of the signal.

Input signal 402 is a square wave. As shown in FIG. 4, input signal 402 does not have a perfectly square profile. Various circuit characteristics result in a non-zero rise and fall time for the edges of the square wave, including rounding of the corners of the signal. Input signal 402 may also contain noise, which is not shown in FIG. 4.

When the delay circuit feeds input signal 402 into the low-delay path and the high-delay path, the respective delay paths may reduce the susceptibility of the delay circuit to noise on input signal 402, introduce insignificant amounts of additional noise to input signal 402, amplify input signal 402, and delay input signal 402, but otherwise input signal 402 is not otherwise distorted by the low-delay path and the high-delay path. Certain example low-delay paths include a single buffer that imparts a minimum delay on input signal 402. Resultantly, low-delay path output signal 404 is a delayed version of input signal 402. In FIG. 4, the first edge of low-delay path output signal 404 corresponds with the leftmost boundary of delay range 410, which represents the minimum amount of delay the delay circuit can impart on an input signal 402.

Certain example high-delay paths include multiple buffers that impart a maximum delay on input signal 402. In some examples, the maximum delay can be increased with the addition of more buffers to the high-delay path. In certain examples, the addition of more buffers to the high-delay path moves the rightmost boundary of delay range 410 further rightward (i.e. the maximum delay of the delay circuit increases) without significantly increasing the susceptibility of the delay circuit to noise. In such examples, the susceptibility of the delay circuit to noise is not significantly increased because the edges of input signal 402 remain fast (i.e. substantially vertical) within the high-delay path. Resultantly, high-delay path output signal 406 is a delayed version of input signal 402. In FIG. 4, the first edge of high-delay path output signal 406 corresponds with the rightmost boundary of delay range 410, which represents the maximum amount of delay the delay circuit can impart on an input signal 402.

The low-delay path output signal 404 and the high-delay path output signal 406 are mixed by the delay circuit at an output buffer. The resultant mixed signal is output as output signal 408. Dependent on the configuration of the arrays of resistive switches, a ratio of effective resistances of the high-delay path and the low-delay path determines the amount of delay imparted on the output signal 408. As shown in FIG. 4, the first edge of output signal 408 resides in between the leftmost border of delay range 410 and the rightmost border of delay range 410.

Figure 5:
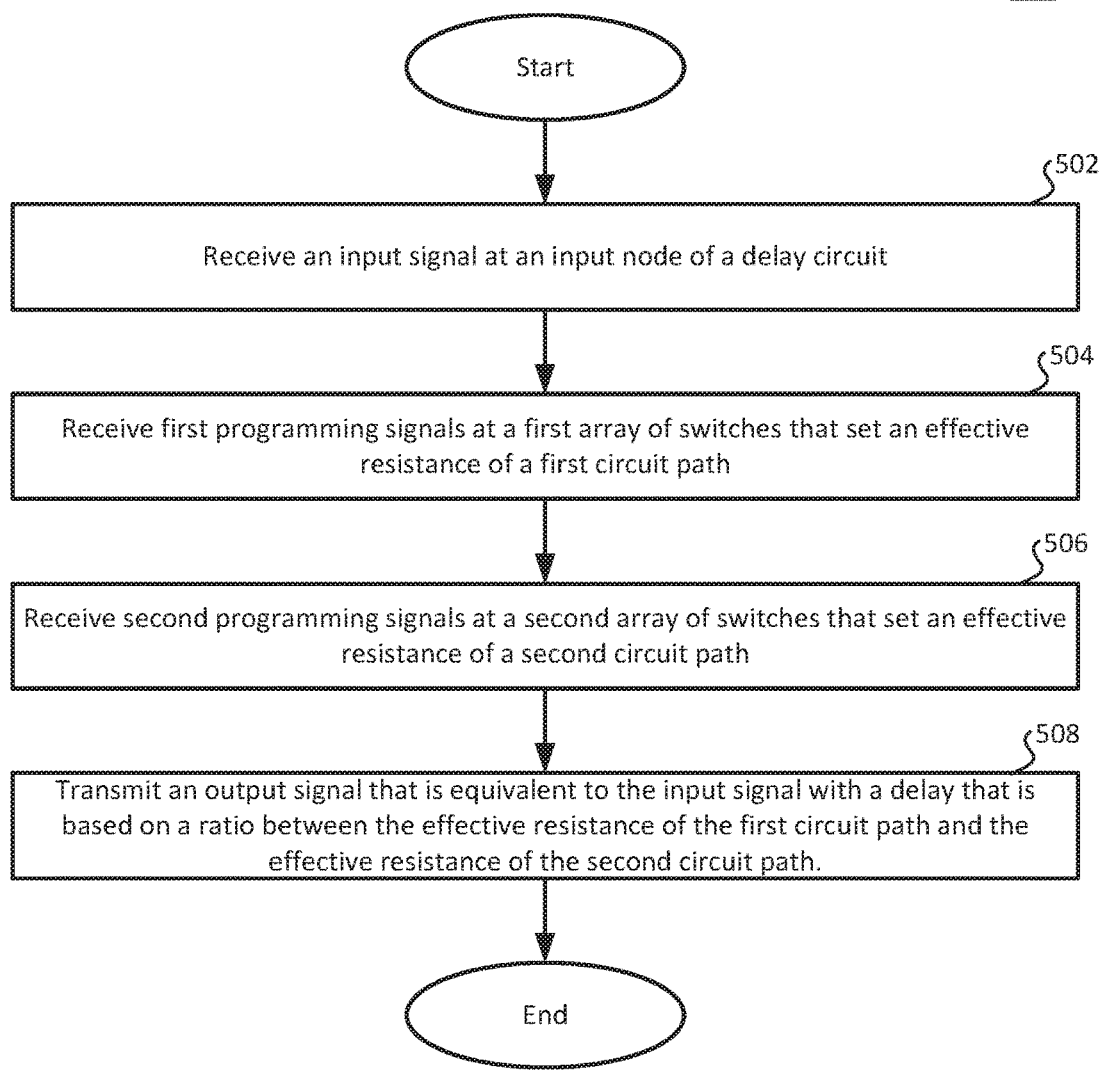
FIG. 5 is a flowchart illustrating an example method for delaying a signal.

FIG. 5 is a flowchart illustrating an example method for delaying a signal. Method 500 delays a signal received at a delay circuit.

In block 502, an input signal is received at an input node of a delay circuit. In some examples, the input signal is a digital signal. In certain examples, the input node is electrically coupled to a low-delay path of the delay circuit and a high-delay path of the delay circuit. In such examples, the input signal is forwarded through the low-delay path and the high-delay path (In certain configurations, the input signal may not be forwarded through one of the low-delay path or the high-delay path).

In block 504, first programming signals are received at a first array of switches that set an effective resistance of a first circuit path. In some examples, the first circuit path is the low-delay path. When a switch of the first array is closed, an electrical path with a certain resistance is completed. The first programming signals open and close parallel switches in the first array, resulting in an effective resistance based on the parallel resistances of the closed switches of the array.

In block 506, second programming signals are received at a second array of switches that set an effective resistance of a second circuit path. In some examples, the second circuit path is the high-delay path. When a switch of the second array is closed, an electrical path with a certain resistance is completed. The second programming signals open and close parallel switches in the second array, resulting in an effective resistance based on the parallel resistances of the closed switches of the array.

In block 508, an output signal that is equivalent to the input signal with a delay is transmitted. The delay is based on a ratio between the effective resistance of the first circuit path and the effective resistance of the second circuit path. In some examples, the configuration of the switches from the first and second received programming signals determines the ratio and thus the delay of the output signal relative to the input signal.

Figure 6:
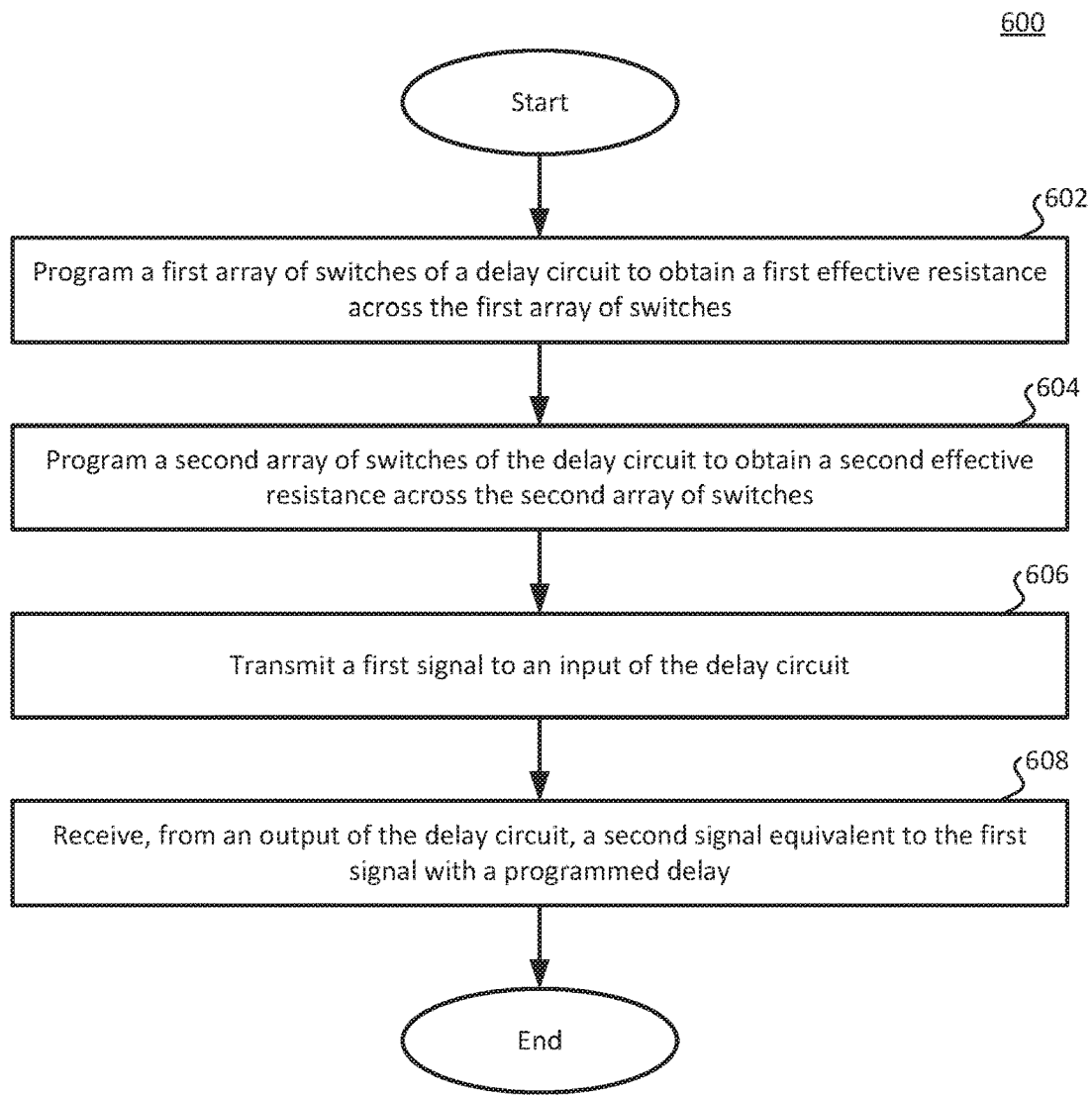
FIG. 6 is a flowchart illustrating an example method for controlling an example delay circuit.

FIG. 6 is a flowchart illustrating an example method for controlling an example delay circuit. Method 600 controls a delay circuit to delay an input signal by a certain delay.

In block 602, a first array of switches of a delay circuit are programmed to obtain a first effective resistance of the first array of switches. In some examples, a controller transmits programming signals to each switch of the first array of switches that controls each switch to cause it to open or close. In certain examples, the controller sends a second programming signal to each switch that is the inverse of the first programming signal. The first array of switches may be included in a low-delay path of the delay circuit.

In block 604, a second array of switches of a delay circuit are programmed to obtain a second effective resistance of the second array of switches. In some examples, a controller transmits programming signals to each switch of the second array of switches that controls each switch to cause it to open or close. In certain examples, the controller sends a second programming signal to each switch that is the inverse of the first programming signal. The second array of switches may be included in a high-delay path of the delay circuit.

In block 606, a first signal is transmitted to an input node of the delay circuit. In some examples, the first signal is a clocked data signal transmitted to a system with an out-of-phase clock. In such examples, the delay circuit may be programmed (in blocks 602 and 604) to align the phases of the first signal and the system clock.

In block 608, a second signal is received from an output of the delay circuit. The second signal is equivalent to the first signal with a programmed delay. In some examples, the programmed delay is based on a ratio of the first effective resistance to the second effective resistance.

Figure 7:
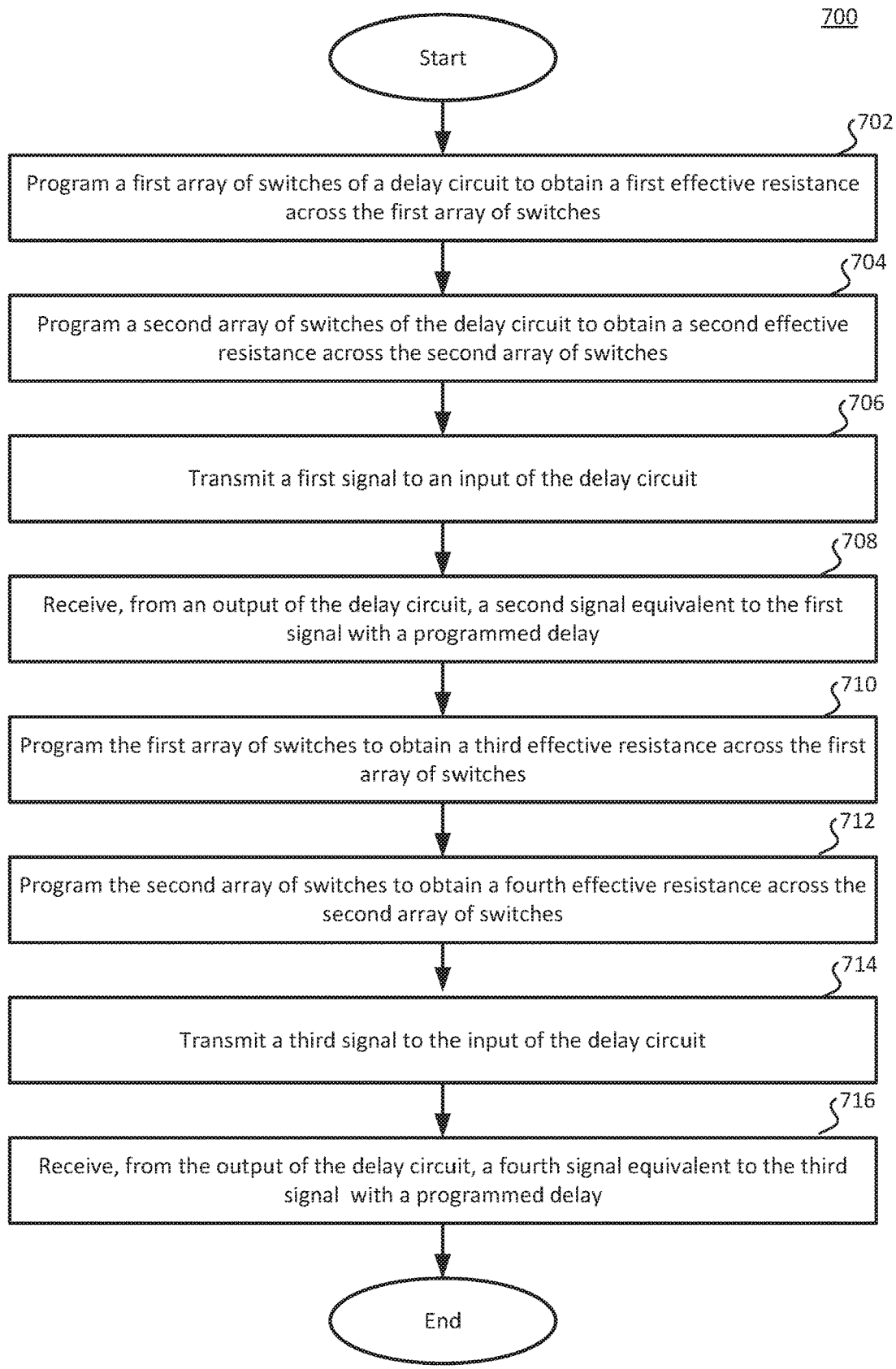
FIG. 7 is a flowchart illustrating an example method for delaying signals.

FIG. 7 is a flowchart illustrating an example method for delaying signals. Method 700 delays a signal by passing it through a delay circuit.

In block 702, a first array of switches of a delay circuit are programmed to obtain a first effective resistance of the first array of switches. In some examples, a controller transmits programming signals to each switch of the first array of switches that controls each switch to cause it to open or close. In certain examples, the controller sends a second programming signal to each switch that is the inverse of the first programming signal. The first array of switches may be included in a low-delay path of the delay circuit.

In block 704, a second array of switches of a delay circuit are programmed to obtain a second effective resistance of the second array of switches. In some examples, a controller transmits programming signals to each switch of the second array of switches that controls each switch to cause it to open or close. In certain examples, the controller sends a second programming signal to each switch that is the inverse of the first programming signal. The second array of switches may be included in a high-delay path of the delay circuit.

In block 706, a first signal is transmitted to an input node of the delay circuit. In some examples, the first signal is a clocked data signal transmitted to a system with an out-of-phase clock. In such examples, the delay circuit may be programmed (in blocks 702 and 704) to align the phases of the first signal and the system clock.

In block 708, a second signal is received from an output of the delay circuit. The second signal is equivalent to the first signal with a programmed delay. In some examples, the programmed delay is based on a ratio of the first effective resistance to the second effective resistance.

In block 710, the first array of switches of the delay circuit are programmed to obtain a third effective resistance of the first array of switches. In some examples, a controller transmits programming signals to each switch of the first array of switches that controls each switch to cause it to open or close. In certain examples, the controller sends a second programming signal to each switch that is the inverse of the first programming signal. The first array of switches may be included in a low-delay path of the delay circuit.

In block 712, the second array of switches of the delay circuit are programmed to obtain a fourth effective resistance of the second array of switches. In some examples, a controller transmits programming signals to each switch of the second array of switches that controls each switch to cause it to open or close. In certain examples, the controller sends a second programming signal to each switch that is the inverse of the first programming signal. The second array of switches may be included in a high-delay path of the delay circuit.

In block 714, a third signal is transmitted to the input node of the delay circuit. In some examples, the third signal is a clocked data signal transmitted to a system with an out-of-phase clock. In such examples, the delay circuit may be programmed (in blocks 710 and 712) to align the phases of the third signal and the system clock.

In block 716, a fourth signal is received from the output of the delay circuit. The fourth signal is equivalent to the third signal with a programmed delay. In some examples, the programmed delay is based on a ratio of the third effective resistance to the fourth effective resistance.

Although the present disclosure has been described in detail, it should be understood that various changes, substitutions and alterations can be made without departing from the spirit and scope of the disclosure. Any use of the words "may" or "can" in respect to features of the disclosure indicates that certain examples include the feature and certain other examples do not include the feature, as is appropriate given the context. Any use of the words "or" and "and" in respect to features of the disclosure indicates that examples can contain any combination of the listed features, as is appropriate given the context.

Phrases and parentheticals beginning with "e.g." are used to provide examples merely for the purpose of clarity. It is not intended that the disclosure be limited by the examples provided in these phrases and parentheticals. The scope and understanding of this disclosure may include certain examples that are not disclosed in such phrases and parentheticals.

The invention claimed is:

1. A delay circuit comprising:
   an input node to receive a first signal;
   a first circuit path comprising:
      a plurality of buffers electrically coupled in series, including a first buffer; and
      a first array of switch-resistor pairs, each switch-resistor pair including a switch electrically coupled in series with a resistor, and each switch-resistor pair electrically coupled in parallel with other switch-resistor pairs of the first array, wherein an effective resistance of the first circuit path is determined by switch positions of each switch-resistor pair of the first array;
   a second circuit path electrically coupled in parallel with the first circuit path, comprising:
      at least one second buffer; and
      a second array of switch-resistor pairs, each switch-resistor pair including a switch electrically coupled in series with a resistor, and each switch-resistor pair electrically coupled in parallel with other switch-resistor pairs of the second array, wherein an effective resistance of the second circuit path is determined by switch positions of each switch-resistor pair of the second array;
   an output buffer receiving a mixed output of the first circuit path and the second circuit path; and
   an output node to transmit a second signal equivalent to the first signal with a delay determined by the effective resistance of the first circuit path and the effective resistance of the second circuit path.

2. The delay circuit of claim 1, wherein the first array of switches and the second array of switches each include switches electrically coupled in parallel, wherein closing a switch completes an electrical path with a resistance.

3. The delay circuit of claim 2, wherein a ratio between the effective resistance of the first array of switches and the effective resistance of the second array of switches determines the delay.

4. The delay circuit of claim 3, wherein the first array of switches and the second array of switches are complementary metal oxide semiconductor (CMOS) switches, and wherein the at least one first buffer and the at least one second buffer include CMOS inverters.

5. The delay circuit of claim 3, wherein the first circuit path is a maximum delay circuit path and the second circuit path is a minimum delay circuit path.

6. The delay circuit of claim 5, wherein a maximum delay of the delay circuit is determined, in part, by a quantity of buffers of the plurality of buffers.

7. The delay circuit of claim 5, wherein a minimum delay of the delay circuit is determined, in part, by a quantity of buffers of the at least one second buffer.

8. A method, comprising:
   programming a first array of switches of a first circuit path of a delay circuit to obtain a first effective resistance across the first array of switches, wherein the first circuit path includes a plurality of buffers electrically coupled in series, including a first buffer;
   programming a second array of different switches of a second circuit path of the delay circuit to obtain a second effective resistance across the second array of switches, wherein the second circuit path is electrically coupled in parallel with the first circuit path, and wherein the second circuit path includes at least one second buffer;

transmitting a first signal to an input of the delay circuit; and receiving, from an output of the delay circuit, a second signal equivalent to the first signal with a programmed delay.

9. The method of claim 8, wherein a ratio between the first effective resistance and the second effective resistance determines the programmed delay.

10. The method of claim 8, wherein the first circuit path is a maximum delay circuit path that delays the first signal by a maximum delay and the second circuit path is a minimum delay circuit path that delays the first signal by a minimum delay.

11. The method of claim 10, wherein the programmed delay is at least the minimum delay and at most the maximum delay.

12. The method of claim 10, wherein the maximum delay is determined, in part, by a quantity of delay stages in the first circuit path and the minimum delay is determined, in part, by a quantity of delay stages in the second circuit path.

13. The method of claim 8, wherein a quantity of switches in the first array of switches and a quantity of switches in the second array of switches determine a quantity of selectable programmed delays.

14. The method of claim 8, further comprising:
programming the first array of switches to obtain a third effective resistance across the first array of switches;
programming the second array of switches to obtain a fourth effective resistance across the second array of switches;
transmitting a third signal to the input of the delay circuit; and
receiving, from the output of the delay circuit, a fourth signal equivalent to the third signal with a different programmed delay.

15. A circuit, comprising:
an input to receive a first signal;
a first circuit path comprising:
one or more first complementary metal oxide semiconductor (CMOS) inverters electrically coupled in series with one another; and
a first array of CMOS switches electrically coupled in series with the one or more first CMOS inverters, wherein each CMOS switch of the first array of CMOS switches is electrically coupled in parallel with other CMOS switches of the first array of CMOS switches;
a second circuit path electrically coupled in parallel to the first circuit path, comprising:
one or more second complementary metal oxide semiconductor (CMOS) inverters electrically coupled in series with one another; and
a second array of CMOS switches electrically coupled in series with the one or more first CMOS inverters, wherein each CMOS switch of the second array of CMOS switches is electrically coupled in parallel with other CMOS switches of the second array of CMOS switches; and
an output buffer to receive a delay signal created from combined output signals from the first circuit path and the second circuit path and to output a second signal equivalent to the first signal with a programmed delay.

16. The circuit of claim 15, wherein the first signal passes through the first circuit path with a maximum delay that is, in part, due to a quantity of the one or more first CMOS inverters and the first signal passes through the second circuit path with a minimum delay that is, in part, due to a quantity of the one or more second CMOS inverters.

17. The circuit of claim 16, wherein the programmed delay is at least the minimum delay and at most the maximum delay.

18. The circuit of claim 15, wherein each CMOS switch of the first array of CMOS switches and each CMOS switch of the second array of CMOS switches completes an electrical path with a known resistance when turned on.

19. The circuit of claim 15, wherein a ratio between a first effective resistance of the first array of CMOS switches and a second effective resistance of the second array of CMOS switches determines the programmed delay.

20. The circuit of claim 19, wherein a controller selects the ratio by turning on one or more CMOS switches of the first or second arrays of CMOS switches.

* * * * *